United States Patent
Sato et al.

(10) Patent No.: US 9,640,564 B2
(45) Date of Patent: May 2, 2017

(54) THIN FILM TRANSISTOR SUBSTRATE

(71) Applicant: JOLED INC., Tokyo (JP)

(72) Inventors: Eiichi Sato, Tokyo (JP); Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/948,857

(22) Filed: Nov. 23, 2015

(65) Prior Publication Data
US 2016/0155762 A1 Jun. 2, 2016

(30) Foreign Application Priority Data
Nov. 28, 2014 (JP) .................................. 2014-242244

(51) Int. Cl.
*H01L 27/12* (2006.01)
*H01L 29/423* (2006.01)

(52) U.S. Cl.
CPC .... *H01L 27/1255* (2013.01); *H01L 29/42384* (2013.01)

(58) Field of Classification Search
CPC ....................... H01L 27/1255; H01L 29/42384
USPC ...................................................... 257/71, 88
See application file for complete search history.

(56) References Cited

U.S. PATENT DOCUMENTS

| | | | |
|---|---|---|---|
| 5,567,633 A | 10/1996 | Gosain et al. | |
| 5,728,610 A | 3/1998 | Gosain et al. | |
| 8,111,221 B2 | 2/2012 | Ono | |
| 2011/0079787 A1* | 4/2011 | Choi | H01L 29/4908 257/71 |
| 2011/0128211 A1 | 6/2011 | Ono | |
| 2013/0075766 A1* | 3/2013 | Chang | H01L 27/1255 257/88 |
| 2014/0264303 A1 | 9/2014 | Ono | |

FOREIGN PATENT DOCUMENTS

JP 07-273347 10/1995

* cited by examiner

*Primary Examiner* — Cuong Q Nguyen
*Assistant Examiner* — Tong-Ho Kim
(74) *Attorney, Agent, or Firm* — Greenblum & Bernstein, P.L.C.

(57) ABSTRACT

A thin film transistor substrate including a thin film transistor and a capacitor formed of a pair of electrodes, which includes: a first electrode above a substrate; a first insulating film above the first electrode; a second electrode above the first insulating film; a second insulating film above the second electrode; and a semiconductor layer above the second insulating film, in which the capacitor includes the first electrode as one of the pair of electrodes and the second electrode as the other of the pair of electrodes, and the thin film transistor includes the second electrode as a gate electrode, the second insulating film as a gate insulating film, and the semiconductor layer as a channel layer.

10 Claims, 5 Drawing Sheets

THIN FILM TRANSISTOR SUBSTRATE

CROSS REFERENCE TO RELATED APPLICATION

The present application is based on and claims priority of Japanese Patent Application No. 2014-242244 filed on Nov. 28, 2014. The entire disclosure of the above-identified application, including the specification, drawings and claims is incorporated herein by reference in its entirety.

FIELD

The present disclosure relates to a thin film transistor substrate including a thin film transistor (TFT).

BACKGROUND

An active-matrix display device, such as a liquid crystal display device or an organic electroluminescence (EL) display device, has pixels arranged in a matrix. Each of the pixels includes a TFT serving as a switching transistor or a drive transistor and a capacitor serving as a storage capacitor.

The TFT includes a gate electrode, a channel layer facing the gate electrode, and a source electrode and a drain electrode which are connected to the channel layer. Two types of structure are known as TFT structures: one is a bottom-gate structure, in which a gate electrode is disposed below the channel layer (on the side close to a substrate); and the other is a top-gate structure, in which a gate electrode is disposed above the channel layer. For example, Patent Literature (PTL) 1 discloses a bottom-gate TFT. Furthermore, the capacitor is formed of a pair of electrodes sandwiching an insulating film.

CITATION LIST

Patent Literature

[PTL 1] Japanese Unexamined Patent Application Publication No. 7-273347

SUMMARY

Technical Problem

In recent years, pixel area has decreased along with the increase in resolution of display devices. Accordingly, it is difficult in a pixel to arrange, together with a TFT, a capacitor having a sufficient storage capacitance.

An object of the technique disclosed herein is to provide a thin film transistor substrate capable of sufficiently and easily ensuring a storage capacitance per pixel.

Solution to Problem

In order to achieve the foregoing object, a thin film transistor substrate according to an aspect of the present disclosure is a thin film transistor substrate including a thin film transistor and a capacitor formed of a pair of electrodes, which includes: a first electrode above a substrate; a first insulating film above the first electrode; a second electrode above the first insulating film; a second insulating film above the second electrode; and a semiconductor layer above the second insulating film, in which the capacitor includes the first electrode as one of the pair of electrodes and the second electrode as the other of the pair of electrodes, and the thin film transistor includes the second electrode as a gate electrode, the second insulating film as a gate insulating film, and the semiconductor layer as a channel layer.

Advantageous Effects

It is possible to sufficiently and easily ensure a storage capacitance per pixel.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

Figure 1:
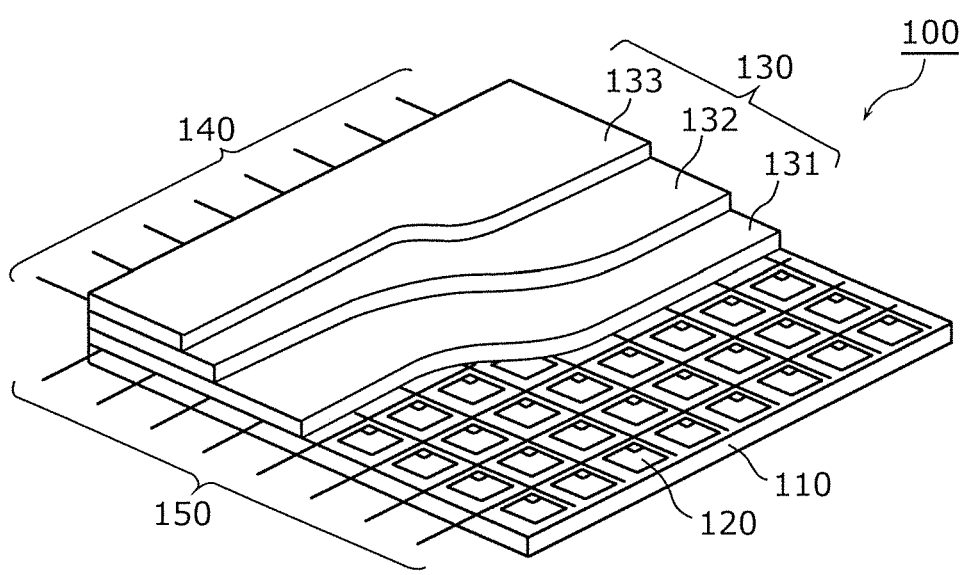
FIG. 1 is a partially cutout perspective view of an organic EL display device according to an embodiment.

An embodiment according to the present disclosure is described herein with reference to the drawings. It should be noted that the following embodiment shows one specific example of the present disclosure. The numerical values, shapes, materials, structural elements, the arrangement and connection of the structural elements, etc., shown in the following embodiment are mere examples, and therefore do not limit the present disclosure. As such, among the structural elements in the following embodiment, structural elements not recited in any one of the independent claims which indicate the broadest concepts of the present disclosure are described as arbitrary structural elements.

It should be noted that the drawings are schematic and not necessarily exact in detail. Furthermore, in the drawings, substantially the same elements are numbered the same, and the description is not repeated or briefly reviewed.

Embodiment

Firstly, the structure of an organic EL display device is described as an example of a display device including a thin film transistor substrate (TFT substrate).

<Organic EL Display Device>

Figure 2:
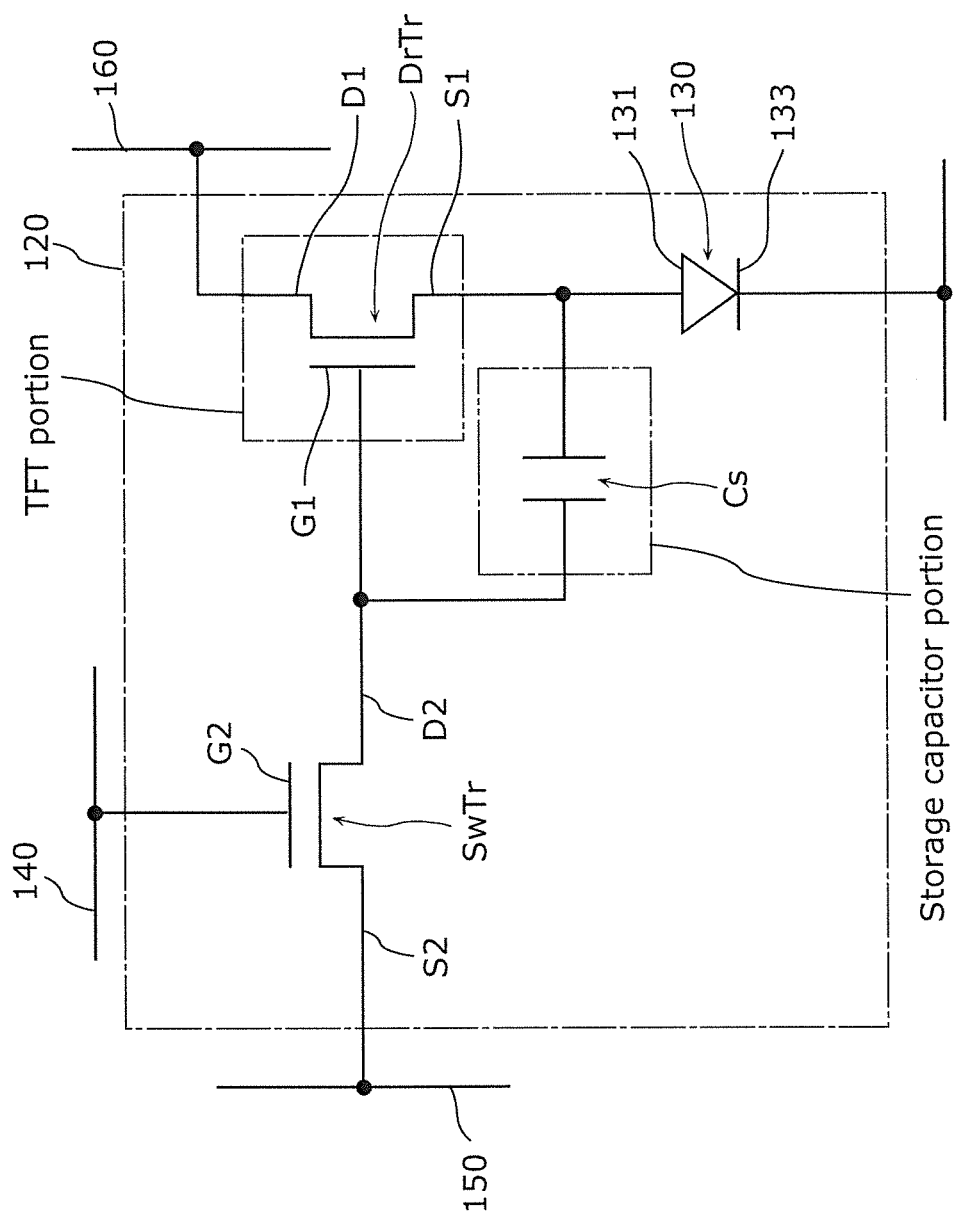
FIG. 2 is an electrical diagram showing a pixel circuit in the organic EL display device according to the embodiment.

FIG. 1 is a partially cutout perspective view of an organic EL display device according to an embodiment. FIG. 2 is an electrical diagram of a pixel circuit in the organic EL display device shown in FIG. 1. It should be noted that the pixel circuit shown in FIG. 2 is an example, and the layout is not limited to this.

As shown in FIG. 1, the organic EL display device 100 includes a TFT substrate 110 in which TFTs are formed, and organic EL elements 130 (light emitting units) disposed above the TFT substrate 110.

The organic EL elements 130 each have a layered structure including an anode 131 which is a lower electrode, an organic EL layer (light emitting layer) 132, and a cathode 133 which is an upper electrode.

The TFT substrate 110 according to the present embodiment is a TFT array substrate having plural TFTs. The organic EL elements 130 are formed on an interlayer insulating film (planarizing layer) disposed so as to cover the TFTs.

The organic EL display device 100 is a top emission device in which light emitted from the organic EL elements 130 exits from the side opposite to the TFT substrate 110 side of the device. In this case, the anode 131 is a reflective electrode made of metal or the like, and the cathode 133 is a transparent electrode made of ITO or the like. It should be noted that the organic EL display device 100 is not limited to the top emission device, and a bottom-emission device in which the light emitted from the organic EL elements 130 exits from the TFT substrate 110 side of the device is also possible.

The TFT substrate 110 includes pixels 120 arranged in a matrix. Each of the pixels 120 includes a pixel circuit formed of circuit elements such as one or more TFTs and a capacitor. Each pixel 120 is driven by the pixel circuit provided for the pixel 120.

Each of the organic EL elements 130 corresponds to a different one of the pixels 120, and luminescence of each organic EL element 130 is controlled by the pixel circuit provided for each pixel 120. The organic EL element 130 has a structure in which the organic EL layer 132 is disposed between the anode 131 and the cathode 133. A hole transport layer is further provided between the anode 131 and the organic EL layer 132, and an electron transport layer is further provided between the organic EL layer 132 and the cathode 133. It should be noted that other functional layer may be provided between the anode 131 and the cathode 133.

The TFT substrate 110 includes: gate lines (scan lines) 140 each disposed along a row of the pixels 120; source lines (signal lines) 150 each disposed along a column of the pixels 120 to intersect with the gate lines 140; and power source lines 160 (not shown in FIG. 1) each disposed parallel to a different one of the source lines 150. The pixel 120 is defined by the gate line 140 and the source line 150 intersecting with each other, for example.

For each of the rows, the gate line 140 is connected to a gate electrode G2 of a switching transistor SwTr in each pixel circuit. For each of the columns, the source line 150 is connected to a source electrode S2 of the switching transistor SwTr in each pixel circuit. For each of the columns, the power source line 160 is connected to a drain electrode D1 of a drive transistor DrTr in each pixel circuit.

As shown in FIG. 2, the pixel circuit includes a TFT serving as the drive transistor DrTr, a TFT serving as the switching transistor SwTr, and a capacitor Cs serving as a storage capacitor (holding capacity) for storing data voltage. In the present embodiment, the drive transistor DrTr is a TFT for driving the organic EL element 130, and the switching transistor SwTr is a TFT for selecting a target pixel 120 for luminescence.

The switching transistor SwTr includes: the gate electrode G2 connected to the gate line 140; the source electrode S2 connected to the source line 150; a drain electrode D2 connected to a gate electrode G1 of the drive transistor DrTr and one of electrodes of the capacitor Cs; and a semiconductor layer (not shown) serving as a channel layer. In the switching transistor SwTr, when a predetermined voltage is applied to the gate line 140 and the source line 150, the voltage applied to the source line 150 is stored in the capacitor Cs as the data voltage.

The drive transistor DrTr includes: the gate electrode G1 connected to the drain electrode D2 of the switching transistor SwTr and the other of the electrodes of the capacitor Cs; the drain electrode D1 connected to the power source line 160; a source electrode S1 connected to the anode 131 of the organic EL element 130 and the other of the electrodes of the capacitor Cs; and the semiconductor layer (not shown) serving as the channel layer. The drive transistor DrTr provides a current corresponding to the data voltage stored in the capacitor Cs from the power source line 160 to the anode 131 of the organic EL element 130 through the source electrode S1. With this, in the organic EL element 130, the organic EL layer emits light by a drive current flowing from the anode 131 to the cathode 133.

It should be noted that the organic EL display device 100 having the above structure employs an active matrix scheme in which display is controlled for each of the pixels 120 located at the intersections of the gate lines 140 and the source lines 150. With this, the corresponding organic EL element 130 selectively emits light by means of the switching transistor SwTr and the drive transistor DrTr in the pixel 120, thereby displaying an intended image.

<TFT Substrate>

Figure 3:
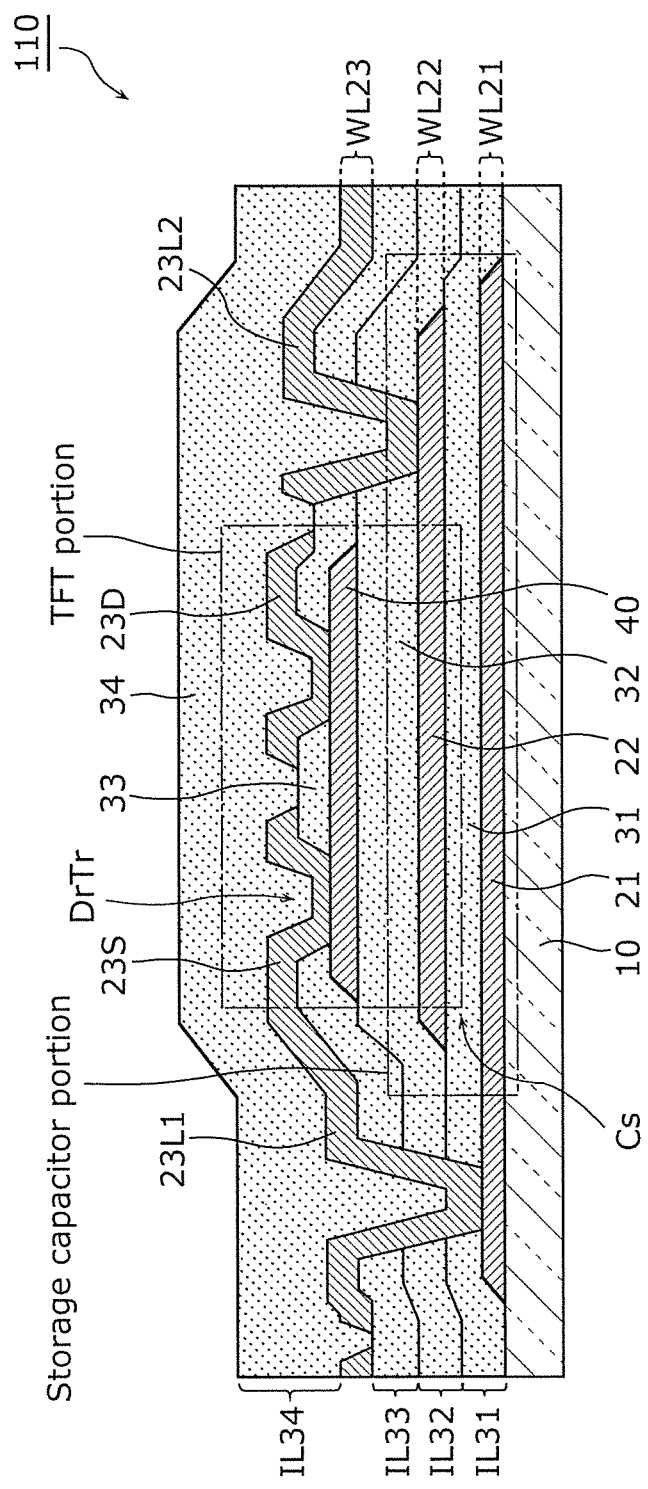
FIG. 3 is a partial cross-sectional view of a TFT substrate according to the embodiment.

Next, a vertical structure of the TFT substrate 110 according to the embodiment is described with reference to FIG. 3. FIG. 3 is a partial cross-sectional view of the TFT substrate 110 according to the embodiment As described above, the TFT substrate 110 includes plural pixels 120 arranged in a matrix. As shown in FIG. 3, each of the pixels includes a TFT portion which is an area including a TFT, and a storage capacitor portion which is an area including the capacitor Cs formed of a pair of electrodes. It should be noted that, in FIG. 3, the drive transistor DrTr is shown as the TFT.

As shown in FIG. 3, the TFT substrate 110 includes: a first electrode 21 above a substrate 10; a first insulating film 31 above the first electrode 21; a second electrode 22 above the first insulating film 31; a second insulating film 32 above the second electrode 22; a semiconductor layer 40 above the second insulating film 32; a third insulating film 33 above the semiconductor layer 40; a source electrode 23S, drain electrode 23D, a first line 23L1, and a second line 23L2 above the third insulating film 33; and a fourth insulating film 34 above the source electrode 23S, the drain electrode 23D, the first line 23L1, and the second line 23L2.

Furthermore, the TFT substrate 110 has a layered structure including interconnecting layers (conductive layers) and insulating layers. As shown in FIG. 3, in the present embodiment, a first interconnecting layer WL21, a first insulating layer IL31, a second interconnecting layer WL22, a second insulating layer IL32, a third insulating layer IL33, a third interconnecting layer WL23, and a fourth insulating layer IL34 are included. It should be noted that the semiconductor layer 40 is disposed between the second insulating layer IL32 and the third insulating layer IL33.

In the first interconnecting layer WL21, the second interconnecting layer WL22, and the third interconnecting layer WL23, the electrodes of the TFT, the electrodes of the capacitor Cs, and conductive members such as various lines are formed by patterning the same conductive films. The first insulating layer IL31, the second insulating layer IL32, the third insulating layer IL33, and the fourth insulating layer IL34 are an interlayer insulating film or a passivation film.

The capacitor Cs includes the first electrode 21 as one of the pair of electrodes and the second electrode 22 as the other of the pair of electrodes. When viewed in the cross-sectional view, the first electrode 21 and the second electrode 22 are faced toward each other with the first insulating film 31 disposed therebetween. When viewed in plan view, the second electrode 22 and the first electrode 21 overlap each other, and the overlapping area serves as the storage capacitor.

The drive transistor DrTr is a bottom-gate TFT, which includes the second electrode 22 as a gate electrode, the second insulating film 32 as a gate insulating film, and the semiconductor layer 40 as a channel layer. In the present embodiment, the drive transistor DrTr is a channel-protective (channel etching stopper type) TFT. In the drive transistor DrTr, the source electrode 23S and the drain electrode 23D have a top-contact structure.

A structural member of each layer in the TFT substrate 110 is described in detail in the following sections.

<Substrate>

The substrate 10 is a glass substrate, but not limited to this. A resin substrate is also possible. Furthermore, the substrate 10 may be not rigid but flexible. It should be noted that an undercoat layer of silicon nitride or silicon oxide may be disposed on the surface of the substrate 10.

<First Interconnecting Layer>

The first interconnecting layer WL21 is the lowermost one of the interconnecting layers, and is located on the substrate 10. The first interconnecting layer WL21 includes the first electrode 21.

A conductive member of the first interconnecting layer WL21 has a single-layer or multilayer structure including one or more conductive films of conductive material such as metal or an alloy thereof. For example, the conductive member is formed of metal such as molybdenum (Mo), aluminum (Al), copper (Cu), tungsten (W), titanium (Ti), manganese (Mn), chromium (Cr), tantalum (Ta), niobium (Nb), silver (Ag), gold (Au), platinum (Pt), palladium (Pd), indium (In), nickel (Ni), neodymium (Nd), or an alloy of metals selected therefrom (molybdenum tungsten (MoW) etc.). It should be noted that the material of the conductive member of the first interconnecting layer WL21 is not limited to them. Conductive metal oxide such as indium tin oxide (ITO) or conductive polymer is also possible.

In the present embodiment, the conductive member of the first interconnecting layer WL21 has a layered structure including a molybdenum film and a copper film. In other words, the first electrode 21 has a layered structure including a molybdenum film and a copper film.

The first electrode 21 is formed on the substrate 10 in a predetermined shape. For example, a conductive film is grown on the substrate 10 by sputtering, and the conductive film is patterned by photolithography and wet-etching. Thus, the first electrode 21 can be formed in a predetermined shape.

As described above, the first electrode 21 is one of the pair of electrodes in the capacitor Cs. More specifically, the first electrode 21 is a lower electrode of the capacitor Cs.

Furthermore, the width of the first electrode 21 is greater than that of the second electrode 22 because the first electrode 21 and the source electrode 23S are connected via the first line 23L1. In other words, the first electrode 21 has a width greater than that of the second electrode 22 to obtain a contact portion to the first line 23L1.

It should be noted that in the present embodiment, the first interconnecting layer WL21 includes only the first electrode 21, but may further include another electrode or line.

<First Insulating Layer>

The first insulating layer IL31 is the lowermost one of the insulating layers. The first insulating layer IL31 is disposed between the first interconnecting layer WL21 and the second interconnecting layer WL22 (second electrode 22), and is located on the first interconnecting layer WL21.

The first insulating layer IL31 includes the first insulating film 31. The first insulating film 31 is disposed between the first electrode 21 and the second electrode 22. It should be noted that the first insulating film 31 is also disposed between the first electrode 21 and the second insulating film 32 as well as between the substrate 10 and the second insulating film 32.

For example, the first insulating film 31 is disposed on the substrate 10 so as to cover the conductive member of the first interconnecting layer WL21. More specifically, the first insulating film 31 is formed on the substrate 10 so as to cover the first electrode 21.

The first insulating film 31 (the first insulating layer IL31) is made of an electrical insulator, and formed of a single layer film such as a silicon oxide film, a silicon nitride film, a silicon oxynitride film, an aluminum oxide film, a tantalum oxide film, or a hafnium oxide film, or a multilayer film including any of these films, for example.

When a silicon oxide film is formed as the first insulating film 31, for example, silane gas ($SiH_4$) and nitrous oxide gas ($N_2O$) are used as introduction gas to form the silicon oxide film by plasma CVD (chemical vapor deposition). It should be noted that the silicon nitride film can be formed by plasma CVD using, for example, silane gas ($SiH_4$), ammonia gas ($NH_3$), and nitrous oxide gas ($N_2O$) as the introduction gas.

The first insulating film 31 is disposed at least between the first electrode 21 and the second electrode 22. In other words, the first insulating film 31 is a dielectric (dielectric film) between the first electrode 21 and the second electrode 22 in the capacitor Cs. Accordingly, the material of the first insulating film 31 may be selected as appropriate according to the required capacitance of the capacitor Cs.

<Second Interconnecting Layer>

The second interconnecting layer WL22 is the second lowermost one of the interconnecting layers. The second interconnecting layer WL22 is disposed between the first insulating layer IL31 and the second insulating layer IL32, and is located on the first insulating layer IL31. The second interconnecting layer WL22 includes the second electrode 22.

A conductive member of the second interconnecting layer WL22 has a single-layer or multilayer structure including one or more conductive films of conductive material such as metal or an alloy thereof, and the same material as the first interconnecting layer WL21 can be used.

In the present embodiment, the material of the conductive member of the second interconnecting layer WL22 is the same as that of the first interconnecting layer WL21. In other words, the member of the second interconnecting layer WL22 has a layered structure including a molybdenum film and a copper film. Accordingly, the second electrode 22 has a layered structure including a molybdenum film and a copper film.

The second electrode 22 is formed above the first insulating layer IL31 in a predetermined shape. For example, a conductive film is grown on the first insulating layer IL31 by sputtering, and the conductive film is patterned by photolithography and wet-etching. Thus, the second electrode 22 can be formed in a predetermined shape.

The second electrode 22 is the gate electrode (Gs in FIG. 2) of the drive transistor DrTr. In other words, the second interconnecting layer WL22 is a gate metal layer.

The second electrode 22 is also the other of the pair of electrodes in the capacitor Cs. More specifically, the second electrode 22 is an upper electrode of the capacitor Cs.

As described above, the second electrode 22 is the gate electrode (Gs in FIG. 2) of the drive transistor DrTr, and also the other of the pair of electrodes in the capacitor Cs. In other words, the second electrode 22 is used as the capacitor electrode of the capacitor as well as the gate electrode of the drive transistor DrTr.

Furthermore, the width of the second electrode 22 is smaller than that of the first electrode 21. In other words, in the storage capacitor portion, the capacitor Cs includes the upper electrode (the second electrode 22) having a width smaller than that of the lower electrode (the first electrode 21) of the capacitor Cs. With this, it is possible to prevent the short circuit of the storage capacitor portion.

It should be noted that the second interconnecting layer WL22 (gate metal layer) also includes the gate electrode of the switching transistor SwTr (G2 in FIG. 2) and the gate line (140 in FIG. 1 and FIG. 2). The second interconnecting layer WL22 (gate metal layer) may further include another electrode or line.

<Second Insulating Layer>

The second insulating layer IL32 is the second lowermost one of the insulating layers. The second insulating layer IL32 is disposed between the second interconnecting layer WL22 and the semiconductor layer 40, and is located on the second interconnecting layer WL22.

The second insulating layer IL32 includes the second insulating film 32. The second insulating film 32 is disposed between the second electrode 22 and the semiconductor layer 40. It should be noted that the second insulating film 32 is also disposed between the first insulating film 31 and the third insulating film 33.

The second insulating film 32 is disposed between the second electrode 22 serving as the gate electrode of the drive transistor DrTr and the semiconductor layer 40 serving as the channel layer of the drive transistor DrTr. In other words, the second insulating film 32 between the second electrode 22 and the semiconductor layer 40 serves as the gate insulating film of the drive transistor DrTr.

For example, the second insulating film 32 is disposed on the first insulating film 31 so as to cover the conductive member of the second interconnecting layer WL22. More specifically, the second insulating film 32 is formed on the first insulating film 31 so as to cover the second electrode 22.

The second insulating film 32 (the second insulating layer IL32) is made of an electrical insulator, and can be formed in the same manner as the first insulating film 31 (the first insulating layer IL31) using the same material as the first insulating film 31 (the first insulating layer IL31).

<Semiconductor Layer>

The semiconductor layer 40 is formed above the second insulating layer IL32 in a predetermined shape. For example, the semiconductor layer 40 is formed in island on the second insulating film 32 serving as the gate insulating film. The semiconductor layer 40 is the channel layer of the drive transistor DrTr, and the semiconductor layer 40 and the second electrode 22 (gate electrode) are faced toward each other with the second insulating film 32 disposed therebetween.

For example, the semiconductor layer 40 is an oxide semiconductor layer of transparent amorphous oxide semiconductor (TAOS) such as $InGaZnO_X$ (IGZO). The material of the oxide semiconductor layer is not limited to IGZO. $InWZnO_X$ or $InSiO_X$ is also possible. Furthermore, the semiconductor layer 40 is not limited to the oxide semiconductor layer. A silicon semiconductor layer formed of crystalline silicon or non-crystalline silicon is also possible.

When the semiconductor layer 40 is formed of IGZO, for example, an IGZO film is grown on the second insulating layer IL32 by sputtering, and the IGZO film is patterned by photolithography and wet-etching. Thus, the semiconductor layer 40 can be formed in a predetermined shape.

<Third Insulating Layer>

The third insulating layer IL33 is the third lowermost one of the insulating layers. The third insulating layer IL33 is disposed between the semiconductor layer 40 and the third interconnecting layer WL23, and is located on the semiconductor layer 40.

The third insulating layer IL33 includes the third insulating film 33. The third insulating film 33 is disposed between the semiconductor layer 40 and the conductive member forming the third interconnecting layer WL23. It should be noted that the third insulating film 33 is also disposed between the second insulating film 32 and the fourth insulating film 34. For example, the third insulating film 33 is formed on the second insulating film 32 so as to cover the semiconductor layer 40.

The third insulating film 33 on the semiconductor layer 40 serves as a channel protective film (channel-etching stopper) for protecting the channel region of the semiconductor layer 40. More specifically, the third insulating film 33 on the semiconductor layer 40 prevents the semiconductor layer 40 from being etched when the source electrode 23S and the drain electrode 23D are patterned by etching above the semiconductor layer 40.

The third insulating film 33 (the third insulating layer IL33) is made of an electrical insulator, and can be formed in the same manner as the first insulating film 31 (the first insulating layer IL31) using the same material as the first insulating film 31 (the first insulating layer IL31).

It should be noted that a silicon oxide film generates less hydrogen than a silicon nitride film during the growth of the film. Accordingly, when oxide semiconductor sensitive to hydrogen is used as a material of the semiconductor layer 40, degradation of the semiconductor layer 40 can be prevented by using a silicon oxide film as the third insulating film 33. Furthermore, when an aluminum oxide film is formed as the third insulating film 33, the aluminum oxide film can block hydrogen and/or oxygen generated in an upper layer than the aluminum oxide film. In view of this, a three-layer film including a silicon oxide film, an aluminum oxide film, and a silicon oxide film in this order can be used as the third insulating film 33, for example.

Furthermore, the third insulating film 33 has first through holes (contact holes) formed so as to extend therethrough. The source electrode 23S and the drain electrode 23D are connected to the semiconductor layer 40 via their respective first through holes. It should be noted that the connections between the source electrode 23S and the semiconductor layer 40 and between the drain electrode 23D and the semiconductor layer 40 are not limited to a direct connection. An indirect connection via conductive material or semiconductor material is also possible.

<Third Interconnecting Layer>

The third interconnecting layer WL23 is the third lowermost one of the interconnecting layers. The third interconnecting layer WL23 is disposed between the third insulating layer IL33 and the fourth insulating layer IL34, and is located on the third insulating layer IL33. The third interconnecting layer WL23 includes the source electrode 23S (S1 in FIG. 2), the drain electrode 23D (D1 in FIG. 2), the first line 23L1, and the second line 23L2.

The source electrode 23S is the source electrode of the drive transistor DrTr (S1 in FIG. 2), and the drain electrode 23D is the drain electrode of the drive transistor DrTr (D1 in FIG. 2). In other words, the third interconnecting layer WL23 is a source-drain metal layer of the drive transistor DrTr. Furthermore, the source electrode 23S and the drain electrode 23D are connected to the semiconductor layer 40 via their respective first through holes (contact holes) provided in the third insulating layer IL33. It should be noted that the source electrode 23S and the drain electrode 23D need not be directly connected to the semiconductor layer 40, and may be indirectly connected to the semiconductor layer 40 via conductive material or semiconductor material.

The first line 23L1 is a line for connecting the source electrode 23S and the first electrode 21. The first line 23L1 is connected to the first electrode 21 via a second through hole (contact hole) extending through three insulating layers of the first insulating layer IL31, the second insulating layer IL32, and the third insulating layer IL33.

The second line 23L2 is a line for connecting the second electrode 22 in the second interconnecting layer WL22 and the drain electrode of the switching transistor not shown in FIG. 3 (D2 in FIG. 2). The second line 23L2 is connected to the second electrode 22 via a third through hole (contact hole) extending through two insulating layers of the second insulating layer IL32 and the third insulating layer IL33.

A conductive member of the third interconnecting layer WL23 has a single-layer or multilayer structure including one or more conductive films of conductive material such as metal or an alloy thereof, and the same material as the first interconnecting layer WL21 can be used.

In the present embodiment, the material of the conductive member of the third interconnecting layer WL23 is the same as that of the first interconnecting layer WL21. In other words, the member of the third interconnecting layer WL23 has a layered structure including a molybdenum film and a copper film. Accordingly, the source electrode 23S, the drain electrode 23D, the first line 23L1, and the second line 23L2 have a layered structure including a molybdenum film and a copper film.

The source electrode 23S, the drain electrode 23D, the first line 23L1, and the second line 23L2 are each formed above the third insulating layer IL33 in a predetermined shape. For example, a conductive film is grown on the third insulating layer IL33 by sputtering, and the conductive film is patterned by photolithography and wet-etching. Thus, the source electrode 23S, the drain electrode 23D, the first line 23L1, and the second line 23L2 can be each formed in a predetermined shape.

In this case, before growing the conductive film, the first through holes for connecting between the source electrode 23S and the semiconductor layer 40 and between the drain electrode 23D and the semiconductor layer 40, the second through hole for connecting between the first line 23L1 and the first electrode 21, and the third through hole for connecting between the second line 23L2 and the second electrode 22 are formed.

It should be noted that the third interconnecting layer WL23 (source-drain metal layer) also includes the source electrode (S2 in FIG. 2) and the drain electrode (D2 in FIG. 2) of the switching transistor SwTr, the source line (150 in FIG. 1 and FIG. 2), and the power source line (160 in FIG. 2). The third interconnecting layer WL23 (source-drain metal layer) may further include another electrode or line.

<Fourth Insulating Layer>

The fourth insulating layer IL34 is the fourth lowermost one of the insulating layers.

The fourth insulating layer IL34 includes the fourth insulating film 34. The fourth insulating film 34 is disposed on the third insulating film 33 so as to cover the conductive member of the third interconnecting layer WL23. More specifically, the fourth insulating film 34 is a passivation film, which is disposed on the third insulating film 33 so as to cover the source electrode 23S, the drain electrode 23D, the first line 23L1, and the second line 23L2.

The fourth insulating film 34 (the fourth insulating layer IL34) is made of an electrical insulator, and can be formed in the same manner as the first insulating film 31 (the first insulating layer IL31) using the same material as the first insulating film 31 (the first insulating layer IL31).

<Operational Advantages>

In the following sections, the operational advantages of the TFT substrate 110 according to the present embodiment are described, including how to conceive the technique disclosed herein.

In recent years, pixel area has decreased along with the increase in resolution of display devices. Accordingly, it is difficult in a pixel to arrange, together with a TFT, a capacitor having a sufficient storage capacitance.

Figure 4:
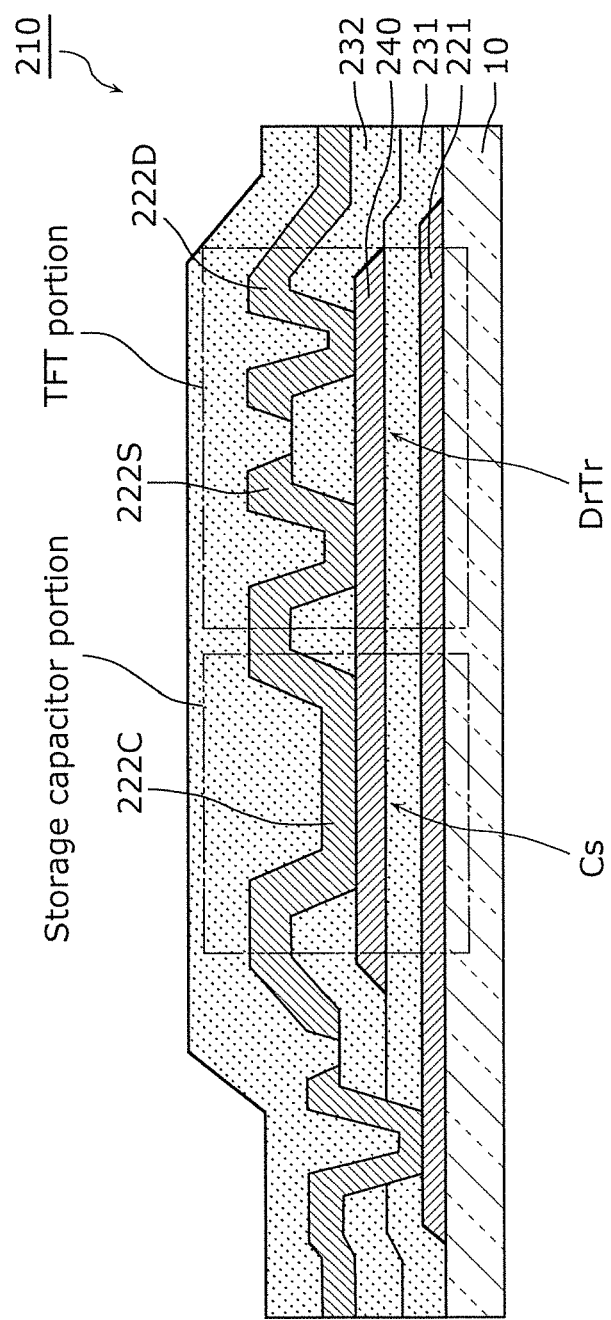
FIG. 4 is a partial cross-sectional view of a TFT substrate according to comparison example 1.

For example, in a TFT substrate 210 according to comparison example 1 shown in FIG. 4, an area including a capacitor Cs (storage capacitor portion) and an area including a drive transistor DrTr (TFT portion) are separate from each other when viewed in plan view.

More specifically, in FIG. 4, the drive transistor DrTr includes: as a gate electrode, a first electrode 221 disposed above a substrate 10; as a gate insulating film, a first insulating film 231 disposed above the first electrode 221; as a channel layer, a semiconductor layer 240 disposed above the first insulating film 231; and as a source electrode 222S and a drain electrode 222D, electrodes disposed via a second insulating film 232 disposed so as to cover the semiconductor layer 240.

The capacitor Cs includes: as a lower electrode, the first electrode 221 in the same layer (gate metal layer) as the gate electrode of the drive transistor DrTr; and as an upper electrode, an electrode 222C in the same layer (source-drain metal layer) as the source electrode and the drain electrode of the drive transistor DrTr.

As can be seen from the above, in the TFT substrate 210 according to comparison example 1, the first electrode 221 and the electrode 222C (a pair of electrodes in the capacitor Cs) are included in the gate metal layer and the source-drain metal layer of the drive transistor DrTr, respectively. Accordingly, it is difficult in a limited pixel area that a pattern of the pair of electrodes in the capacitor Cs has a sufficient size. Furthermore, flexibility of the layout for the pair of electrodes in capacitor Cs is low.

Figure 5:
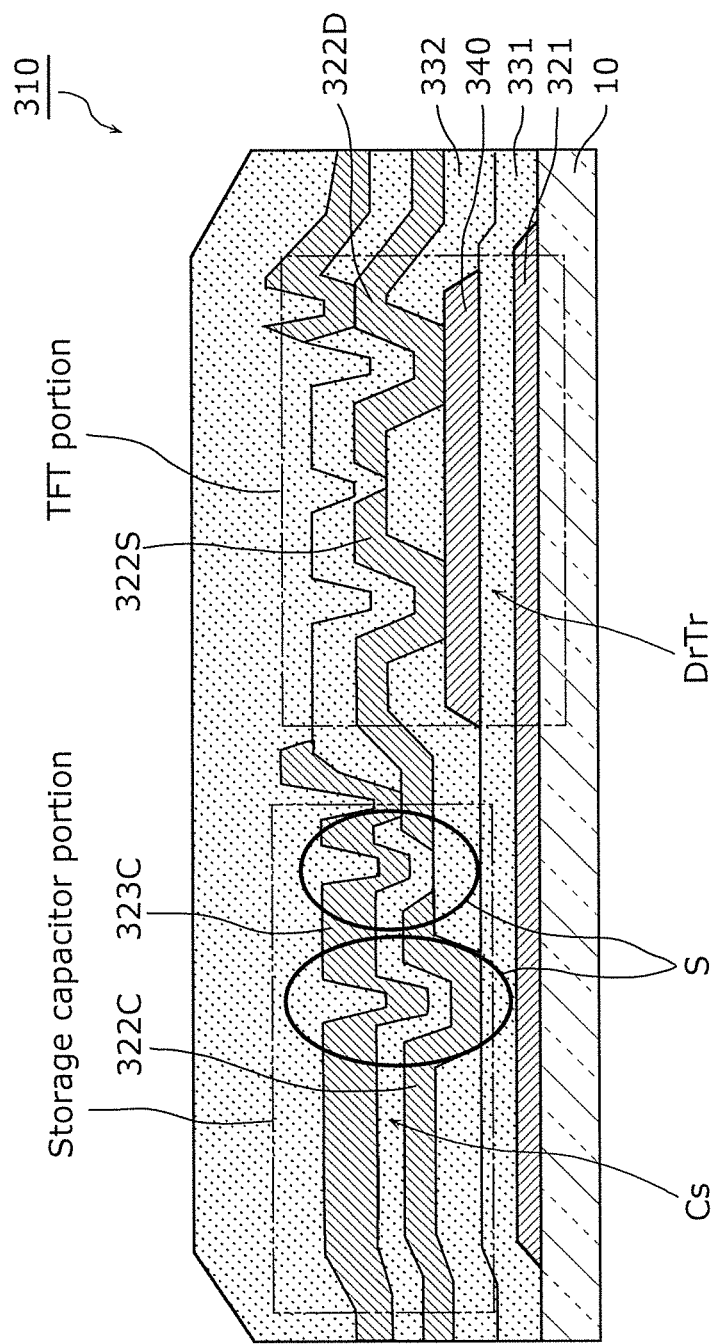
FIG. 5 is a partial cross-sectional view of a TFT substrate according to comparison example 2.

In view of this, another TFT substrate 310 as shown in FIG. 5 is also considered. In the TFT substrate 310 according to comparison example 2 shown in FIG. 5, a lower electrode (electrode 322C), which is one of electrodes in capacitor Cs, is included in a source-drain metal layer of a drive transistor DrTr, whereas an upper electrode (electrode 323C), which is the other of the electrodes in capacitor Cs, is included in an upper interconnecting layer than the source-drain metal layer of the drive transistor DrTr.

It should be noted that, like the drive transistor DrTr according to comparison example 1, the drive transistor DrTr according to comparison example 2 includes: as a gate electrode, a first electrode 321 disposed above a substrate 10; as a gate insulating film, a first insulating film 331 disposed above the first electrode 321; as a channel layer, a semiconductor layer 340 disposed above the first insulating film 331; and as a source electrode 322S and a drain electrode 322D, electrodes disposed via a second insulating film 332 disposed so as to cover the semiconductor layer 340.

However, in both the TFT substrate 210 according to comparison example 1 and the TFT substrate 310 according to comparison example 2, the storage capacitor portion and the TFT portion are separate from each other when viewed in plan view, and thus it is impossible to increase the storage capacitance per pixel.

Moreover, in comparison example 2, the one of the electrodes in the capacitor Cs (lower electrode) 322C is included in the source-drain metal layer of the drive transistor, and the other of the electrodes in the capacitor Cs (upper electrode) 323C is included in an upper interconnecting layer than the source-drain metal layer of the drive transistor. Accordingly, a contact portion for connecting a line and an electrode and/or an overlaid portion of a lower line exist in the storage capacitor portion, and thus, as shown in region S in FIG. 5, a step of the line or electrode in the source-drain metal layer causes steps of the electrodes 322C and 323C in the capacitor C. Accordingly, the withstand voltage of the electrodes 322C and 323C in the capacitor is decreased, and this may lead to a short-circuit failure or the like.

In contrast, in a TFT substrate 110 according to the present embodiment, as shown in FIG. 3, one of electrodes in a capacitor Cs is the first electrode 21, and the other of the electrodes in the capacitor Cs is the second electrode 22 which also serves as a gate electrode of a drive transistor DrTr. In other words, the second electrode 22 is included in the gate metal layer of the drive transistor DrTr, and is used as the upper electrode of the capacitor Cs as well as the gate electrode of the drive transistor DrTr.

Furthermore, the drive transistor DrTr including the second electrode 22 as the gate electrode has a bottom-gate structure, and is formed above the capacitor Cs.

Accordingly, in the TFT substrate 110 according to the present embodiment, a TFT portion, which is an area including the drive transistor DrTr, is disposed above a storage capacitor portion, which is an area including the capacitor Cs. In other words, the storage capacitor portion is disposed below the TFT portion, and the TFT portion and the storage capacitor portion overlap each other when viewed in plan view.

This structure increases size (area) and/or flexibility of shape of the first electrode 21 serving as the lower electrode of the capacitor Cs. Thus, with the TFT substrate 110 according to the present embodiment, the area of the electrode pattern of the capacitor Cs is easily increased compared with those in comparison example 1 and comparison example 2. Accordingly, it is possible to sufficiently and easily ensure a storage capacitance per pixel.

Furthermore, in the present embodiment, the second electrode 22 is used as the gate electrode of the drive transistor DrTr as well as the upper electrode of the capacitor Cs. Accordingly, photolithography steps (the number of masks) can be reduced compared with the case where the gate electrode of the drive transistor DrTr and the upper electrode of the capacitor Cs are formed separately.

Furthermore, in the present embodiment, the first electrode 21 serving as the lower electrode of the capacitor Cs is included in the first interconnecting layer WL21 which is the lowermost layer. Accordingly, even when the area of the first electrode 21 is increased, the first electrode 21 can be formed without producing steps therein. Furthermore, the second electrode 22 serving as the upper electrode of the capacitor Cs is included in the second lowermost one of the interconnecting layers (the second interconnecting layer WL22). Accordingly, an underlying layer, the surface state of which affects the second electrode 22, is only the first insulating film 31 formed on the first electrode 21 having a flat surface. With this, it is possible to easily form the second electrode 22 having large area and no steps without thickening the first insulating film 31.

Moreover, in the present embodiment, the first interconnecting layer WL21 includes only the first electrode 21 serving as the lower electrode of the capacitor Cs. With this, it is possible to determine the shape and/or size of the first electrode 21 in consideration of only the capacitor Cs.

Furthermore, in the present embodiment, the first insulating layer IL31 (first insulating film 31) can only serve as a dielectric (dielectric film) in the capacitor Cs. Accordingly, the material of the first insulating film 31 may be selected as appropriate according to the required capacitance of the capacitor Cs.

Furthermore, the TFT substrate 110 according to the present embodiment has the source electrode 23S and the drain electrode 23D which are connected to the semiconductor layer 40 via their respective first through holes extending through only the first insulating film 31. The source electrode 23S is further connected to the first electrode 21 included in a lower interconnecting layer than the gate metal layer. More specifically, the source electrode 23D is connected, by means of the first line 23L1, to the first electrode 21 via the second through hole extending through the three-layer film including the first insulating film 31, the second insulating film 32, and the third insulating film 33.

In this case, the first through hole is formed by etching only one layer, i.e. the third insulating film 33. The second through hole, however, is formed by etching three layers, i.e. the first insulating film 31, the second insulating film 32, and the third insulating film 33. In this case, the second through hole formed by a single etching step has a hole diameter greater than that of the first through hole because the second through hole is deeper than the first through hole. In view of this, the first through hole and the second through hole can be formed by several etching steps (two or three steps) to reduce an increase in hole size, thereby decreasing the hole diameter of the second through hole. In addition, the coverage of conductive material in the contact portion (metal) can be improved.

Furthermore, in the TFT substrate 110 according to the present embodiment, the width of the second electrode 22 is smaller than that of the first electrode 21.

With this, it is possible to prevent the short circuit of the area including the capacitor Cs (storage capacitor portion).

<Variations>

A thin film transistor substrate and an organic EL display device are described above with reference to the present embodiment, but the technique disclosed herein is not limited to the above embodiment.

For example, in the above embodiment, the TFT included in the TFT portion is a drive transistor DrTr, but a switching transistor SwTr is also possible. In other words, the technique disclosed herein is applicable to a combination of a switching transistor SwTr and a capacitor Cs. It should be noted that the structure of the switching transistor SwTr is the same as that of the drive transistor DrTr.

Furthermore, in the above embodiment, the electrode of the drive transistor DrTr connected to the first electrode 21 is the source electrode 23S, but the drain electrode 23D may be connected to the first electrode 21 depending on the layout of the pixel circuit or the type of the drive transistor DrTr.

Furthermore, in the above embodiment, the drive transistor DrTr and the switching transistor SwTr are of channel etching stopper type (channel protective type), but channel etching type is also possible.

Furthermore, in the above embodiment, the pixel circuit in a pixel has a 2Tr1C structure including two TFTs (the drive transistor DrTr and the switching transistor SwTr) and one capacitor Cs, but is not limited to this. For example, three or more TFTs may be provided in a pixel, and two or more capacitors may be included in the pixel.

Furthermore, in the above embodiment, the organic EL display device is described as a display device including the thin film transistor substrate, but the thin film transistor substrate is applicable to another display device including an active matrix substrate, such as a liquid crystal display device.

Furthermore, the foregoing display device (display panel) such as the organic EL display device is applicable to any electronic devices such as television sets, personal computers, mobile phones, and mobile terminals.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The technique disclosed herein is widely applicable to display devices such as an organic EL display device including a TFT substrate, for example.

The invention claimed is:

1. A thin film transistor substrate including a thin film transistor and a capacitor formed of a pair of electrodes, the thin film transistor substrate comprising:
a first electrode above a substrate;
a first insulating film above the first electrode;
a second electrode above the first insulating film;
a second insulating film above the second electrode;
a semiconductor layer above the second insulating film; and
a source electrode and a drain electrode, each at least partially above the semiconductor layer,
wherein the capacitor includes the first electrode as one of the pair of electrodes and the second electrode as an other of the pair of electrodes,
the thin film transistor includes the second electrode as a gate electrode, the second insulating film as a gate insulating film, the semiconductor layer as a channel layer, and the source electrode and the drain electrode,
one of the source electrode and the drain electrode is directly connected to the first electrode, and
a first interconnecting layer of the thin film transistor includes only the first electrode, with the first electrode comprising a continuous layer which is directly connected to the one of source electrode and the drain electrode.

2. The thin film transistor substrate according to claim 1, further comprising:
a third insulating film above the semiconductor layer, wherein the one of the source electrode and the drain electrode is directly connected to the first electrode via a through hole extending through the first insulating film, the second insulating film, and the third insulating film.

3. The thin film transistor substrate according to claim 2, wherein a hole diameter of the through hole extending through the third insulating film is greater than a hole diameter of the through hole extending through the second insulating film, and
the hole diameter of the through hole extending through the second insulating film is greater than a hole diameter of the through hole extending through the first insulating film.

4. The thin film transistor substrate according to claim 2, wherein the source electrode and the drain electrode are directly connected to the semiconductor layer via second through holes extending through the third insulating film.

5. The thin film transistor substrate according to claim 4, wherein a hole diameter of the through hole via which the one of the source electrode and the drain electrode is directly connected to the first electrode is greater than hole diameters of the second through holes via which the source electrode and the drain electrode are directly connected to the semiconductor layer.

6. The thin film transistor substrate according to claim 1, wherein the second electrode has a width smaller than a width of the first electrode.

7. The thin film transistor substrate according to claim 1, wherein the thin film transistor substrate has a plurality of pixels arranged in a matrix,
capacitors and thin film transistors are provided, each of the capacitors being the capacitor, each of the thin film transistors being the thin film transistor and serving as a drive transistor, and
each of the pixels includes one of the capacitors and one of the thin film transistors.

8. The thin film transistor substrate according to claim 1, wherein the one of the source electrode and the drain electrode is directly connected to the first electrode via a through hole extending through the first insulating film and the second insulating film.

9. The thin film transistor substrate according to claim 8, wherein a hole diameter of the through hole extending through the second insulating film is greater than a hole diameter of the through hole extending through the first insulating film.

10. A thin film transistor substrate including a thin film transistor and a capacitor formed of a pair of electrodes, the thin film transistor substrate comprising:
a first electrode above a substrate;
a first insulating film above the first electrode;
a second electrode above the first insulating film;
a second insulating film above the second electrode;
a semiconductor layer above the second insulating film;
a third insulating film above the semiconductor layer; and
a source electrode and a drain electrode, each at least partially above the semiconductor layer,
wherein the capacitor includes the first electrode as one of the pair of electrodes and the second electrode as an other of the pair of electrodes,
the thin film transistor includes the second electrode as a gate electrode, the second insulating film as a gate insulating film, the semiconductor layer as a channel layer, and the source electrode and the drain electrode,
one of the source electrode and the drain electrode is directly connected to the first electrode via a through hole extending through the first insulating film, the second insulating film, and the third insulating film, the source electrode and the drain electrode are directly connected to the semiconductor layer via second through holes extending through the third insulating film, and a hole diameter of the through hole via which the one of the source electrode and the drain electrode is directly connected to the first electrode is greater than hole diameters of the second through holes via which the source electrode and the drain electrode are directly connected to the semiconductor layer.

\* \* \* \* \*